United States Patent
Voigt et al.

(10) Patent No.: US 9,229,074 B2
(45) Date of Patent: Jan. 5, 2016

(54) METHOD FOR CALCULATING LOCAL SPECIFIC ENERGY ABSORPTION RATE (SAR) IN NUCLEAR MAGNETIC RESONANCE

(75) Inventors: Tobias Ratko Voigt, Hamburg (DE); Ulrich Katscher, Norderstedt (DE); Hanno Heyke Homann, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 659 days.

(21) Appl. No.: 13/514,611

(22) PCT Filed: Dec. 28, 2010

(86) PCT No.: PCT/IB2010/056095
§ 371 (c)(1),
(2), (4) Date: Jun. 8, 2012

(87) PCT Pub. No.: WO2011/080700
PCT Pub. Date: Jul. 7, 2011

(65) Prior Publication Data
US 2012/0262174 A1    Oct. 18, 2012

(30) Foreign Application Priority Data
Dec. 31, 2009 (EP) .................... 09181034

(51) Int. Cl.
*G01R 33/28* (2006.01)
*G01R 33/24* (2006.01)
*G01R 33/44* (2006.01)
*G01R 33/54* (2006.01)
*G01R 33/56* (2006.01)

(52) U.S. Cl.
CPC ............ *G01R 33/288* (2013.01); *G01R 33/246* (2013.01); *G01R 33/443* (2013.01); *G01R 33/543* (2013.01); *G01R 33/546* (2013.01); *G01R 33/5608* (2013.01)

(58) Field of Classification Search
CPC .. G01R 33/288; G01R 33/246; G01R 33/443; G01R 33/543; G01R 33/546; G01R 33/5608
See application file for complete search history.

(56) References Cited

U.S. PATENT DOCUMENTS

| | | | |
|---|---|---|---|
| 7,282,914 B2 | 10/2007 | Morich et al. | |
| 8,754,644 B2 * | 6/2014 | Trakic et al. | ............ 324/307 |
| 2007/0108976 A1 | 5/2007 | Morich et al. | |
| 2007/0241753 A1 | 10/2007 | Sodickson et al. | |

(Continued)

FOREIGN PATENT DOCUMENTS

| | | |
|---|---|---|
| JP | 20000097878 A | 4/2000 |
| WO | 2007017779 A2 | 2/2007 |

OTHER PUBLICATIONS

"Egil", Specific absorption rate, Dec. 24, 2010, Wikipedia.*

(Continued)

*Primary Examiner* — Dixomara Vargas

(57) ABSTRACT

A method and system for calculating a local specific energy absorption rate (SAR) is based on an electric parameter and the mass density of a segmented geometry of an object and a magnetic field vector distribution of a radio frequency (RF) antenna. The values of the electric parameter and the mass density are pre-determined values, while the magnetic field vector distribution is estimated by a magnetic field mapping method based on a magnetic resonance (MR) scan, such as a $B_1$ mapping method.

13 Claims, 2 Drawing Sheets

(56) References Cited

U.S. PATENT DOCUMENTS

2010/0134105 A1* 6/2010 Zelinski et al. ............... 324/309
2012/0139541 A1* 6/2012 Weiss et al. ................... 324/318

OTHER PUBLICATIONS

Collins, C. M., et al.; Signal-to-Noise Ratio and Absorbed Power as Functions of Main Magnetic Field Strength, and Definition of "90°" RF Pulse for the Head in the Birdcage Coil; 2001; Magnetic Resonance in Medicine; 45:684-691.

Collins, C. M., et al.; SAR and B1 Field Distributions in a Heterogeneous Human Head Model within a Birdcage Coil; 1998; MRM; 40:847-856.

Ibrahim, T. S., B1 field homogeneity and SAR calculations for the birdcage coil; 2001; Phys. Med. Biol.; 46:609-619.

Katscher, U., et al.; Determination of Electric Conductivity and Local SAR Via B1 Mapping; 2009; IEEE Trans. on Medical Imaging; 28(9)1365-1374.

Liu, W., et al.; Calculations of B1 Distribution, Specific Energy Absorption Rate, and Intrinsic Signal-to-Noise Ratio for a Body-Size Birdcage Coil Loaded with Different Human Subjects at 64 and 128 MHz; 2005; Appl. Magn. Reson.; 29:5-18.

Pradier, A., et al.; SAR Assessment Using Tissues Homogenization Technique; 2006; Proc. 'EuCAP; Nice, France; pp. 6-10.

Yarnykh, V. L.; Actual Flip-Angle Imaging in the Pulsed Steady State: A Method for Rapid Three-Dimensional Mapping of the Transmitted Radiofrequency Field; 2007; MRM; 57:192-200.

Katscher, U., et al.; Estimation of local SAR using B1 mapping; 2008; Proc. Intl. Soc. Mag. Reson. Med.; 16:1191.

Gabriel, S., et al.; The dielectric properties of biological tissues: III. Parametric models for the dielectric spectrum of tissues; 1996; Phys. Med. Biol.; 41:2271-2293.

Press, W. H., et al.; Numerical Recipes in C: Section 14.8 Savitzky-Golay Smoothing Filters; 1995; Cambridge University Press; 6 pages.

* cited by examiner

METHOD FOR CALCULATING LOCAL SPECIFIC ENERGY ABSORPTION RATE (SAR) IN NUCLEAR MAGNETIC RESONANCE

FIELD OF THE INVENTION

The invention relates to a method for calculating local specific energy absorption rate (SAR). The invention also relates to a magnetic resonance system and to a computer program comprising instructions for calculating a local specific energy absorption rate (SAR).

BACKGROUND OF THE INVENTION

Magnetic Resonance Imaging (MRI) is a medical imaging technique most commonly used in radiology to visualize a detailed internal structure and a function of a body of a human being. MRI uses a powerful magnetic field to align nuclear magnetization of usually hydrogen atoms in water in the body. Radio frequency (RF) fields are used to systematically alter the alignment of this magnetization, causing hydrogen nuclei to produce a rotating magnetic field detectable by a scanner. This detected signal can be manipulated by additional magnetic fields to build up enough information to construct an image of the body.

During a MRI procedure, the patient absorbs a portion of a transmitted RF energy, which can result in body tissue heating and other adverse effects, such as alterations in visual, auditory and neural functions. The so-called Specific Absorption Rate (SAR), in watts per kilogram (W/kg), is the RF power absorbed per unit mass of tissue. The SAR is one of the most important parameters related with thermal effects and acts as a guideline for MRI safety.

For an exact determination of local SAR, a spatial distribution of an electric field of the involved RF coil throughout the patient as well as an electric conductivity and permittivity distribution and a mass density throughout the patient is required. In principle, the electric field can be calculated from three spatial components of the magnetic field. A spatial distribution of the electric properties conductivity and permittivity can be determined via Ampere's law known in the art.

No reliable method has been found to determine in vivo the electric field and electric conductivity, and thus, the local SAR. Instead, rough estimations are performed, based on models. These models are based on human anatomy obtained from single individuals in a fixed position. Usually, the body is dissected into sub-cm voxels, each assigned a particular tissue type and thus well-defined electric properties, i.e. electric conductivity $\sigma$ and permittivity $\in$, and mass density $\rho$. Using a model of the applied RF coil, the electric fields and accordingly local SAR are determined via simulations. This approach is not patient specific with regard to individual anatomy and position. Patient specific models within this framework are not practicable due to the simulation times of several hours. The uncertainties of such models require large safety margins, frequently leading to a potentially unnecessary increase of the repetition time, and thus, the total acquisition time.

An embodiment of such a method is disclosed in WO-2007017779 A2 patent application. The method according to this patent application aims at measuring the body electric properties $\sigma$ and $\in$ via measuring magnetic fields produced by a RF coil and performing simulations. For SAR computation, the measured electric properties are used together with electric fields computed via simulation using patient models and RF coil models. Such simulation is based on the measurement of the magnetic fields.

A drawback of the known system is that the full simulation of coil and patient is very time consuming, in particular at least several hours, and thus not practicable in a clinical setting.

SUMMARY OF THE INVENTION

It is an object of the present invention to provide a method which is suitable for application into a clinical setting. Particularly, it is the object of the present invention to provide a method by means of which SAR calculation is done in a relatively short period of time.

A method for calculating local specific energy absorption rate (SAR) is based on an electric parameter and the mass density of a segmented geometry of an object and a magnetic field vector distribution of a radio frequency (RF) antenna, where the values of the electric parameter and the mass density are pre-determined values, while the magnetic field vector distribution is estimated by a magnetic field mapping method based on a magnetic resonance (MR) scan. The object can be a living being, particularly a human being or an animal.

In an embodiment of the invention the segmented geometry of the object can be obtained from a survey scan of the object. The survey scan can be a low resolution scan. The segmented geometry can be obtained also by the above mentioned magnetic resonance (MR) scan, i.e. a separate survey scan is not needed. The advantage of this embodiment is that the segmented geometry of the object is determined for every particular object. If the object is a human being, the segmented geometry is not predetermined, i.e. determined in advance for a single human being and further used for other human beings for whom the SAR should be calculated. Instead, for every particular human being to be examined the segmented geometry is obtained from the survey scan of that particular human being.

The magnetic field mapping method based on a magnetic resonance scan can be a $B_1$ mapping method. The estimate of the magnetic field can obtained from a measurement of a $H^+$ component of the $B_1$ field and a $H^-$ component and Hz component of the $B_1$ field can be considered to be null.

The electric parameter can include the electric conductivity and permittivity of the segmented geometry.

The pre-determined values of the electric parameter and the mass density can be taken from literature.

The method according to the invention does not involve electro-magnetic field simulation. Nevertheless, the method according to the invention provides an approximation for local SAR that is reliable and valid in a large variety of imaging situations. The method provides an estimate for local SAR that is patient specific with respect to the patient's anatomy and position. Local SAR is estimated from $B_1$ mapping, which makes it also scanner specific and fast since lengthy field simulations can be skipped. It is noted that $B_1$ mapping techniques are known in the art. Detailed information about $B_1$ mapping per se can be found in e.g. the article "Actual flip-angle imaging in the pulsed steady state: a method for rapid three-dimensional mapping of the transmitted radiofrequency field" by Yarnykh V L. MRM 57 (2007) 192-200. Since the method according to the invention does not apply simulation, the SAR calculation is done in the relatively short period of time. The SAR calculation according to the method of the invention can be done in a range of few seconds to few minutes depending on desired $B_1$ mapping, i.e. a desired image resolution and a desired signal-noise ratio. Thus, the method according to the invention is particularly practicable in a clinical setting. The method according to the invention can be applied into all kinds of MR scans, and in particular scans suffering from SAR limitations. The method can also be applied if patients have metallic implants because of the possibility of careful control of local SAR near these implants, instead of excluding these patients from MR studies. In general, diagnostic scans can be performed at elevated RF power levels using the SAR map to avoid exceeding local SAR limits.

It is also an object of the present invention to provide a magnetic resonance system by means of which SAR calculation can be done in a relatively short period of time. The system uses the above described method for the specific energy absorption rate (SAR) calculation. The system comprises:
- a main magnet (12) for generating a main magnetic field in an examination region,
- a radio frequency antenna (16) for emitting a radio frequency field in the examination region and receiving an induced magnetic resonance (MR) from the examination region, and
- a specific energy absorption rate calculation processor (36) for calculating a specific energy absorption rate (SAR) for an object accommodated in the examination region on basis of both an estimate of the magnetic field obtained from the received induced magnetic resonance (MR) and an electric parameter of an object's tissue and a mass density of the object's tissue as assigned to a segmented object's geometry, wherein the electric parameter and the mass density are obtained from a database (42) with values of the electric parameter of the object's tissue at magnetic resonance (MR) Larmor Frequency and the mass density of the object's tissue.

The main magnetic field generated by the main magnet can be substantially uniform in order to enable a good image quality.

The segmented geometry of the object can be obtained from a survey scan of the object.

A $B_1$ mapping method can be used for the estimate of the magnetic field.

The estimate of the magnetic field can be obtained from a measurement of a $H^+$ component of a $B_1$ field and wherein a $H^-$ component and Hz component of the $B_1$ field are considered to be null.

The electric parameter can include the electric conductivity and permittivity of the segmented geometry.

The pre-determined values of the electric parameter and the mass density can be taken from literature.

In an embodiment of the system according to the invention the system further comprises a user interface for identifying at least one region of interest for which the specific energy absorption rate (SAR) is to be determined by the specific energy absorption rate calculation processor.

It is also an object of the present invention to provide a computer program comprising instructions for calculating a local specific energy absorption rate (SAR) according to the above mentioned method. The above mentioned magnetic resonance system can be provided with the computer program. The computer program can be stored on any media known in the art, for example a compact disc (CD), a memory stick, a hard disc etc.

BRIEF DESCRIPTION OF THE DRAWINGS

In the following, the invention and further aspects will be described, by way of example, and explained hereinafter, using the following figures.

DETAILED DESCRIPTION OF THE EMBODIMENTS

In the following description of the preferred embodiments, reference is made to the accompanying drawings which form a part thereof. Specific embodiments, in which the invention may be practiced, are shown in the following description by a way of illustration. It is also understood that other embodiments may be utilized and structural changes may be made without departing from the scope of the present invention. It is noted that the same reference signs will be used for indicating the same or similar parts in the several embodiments.

Figure 1:
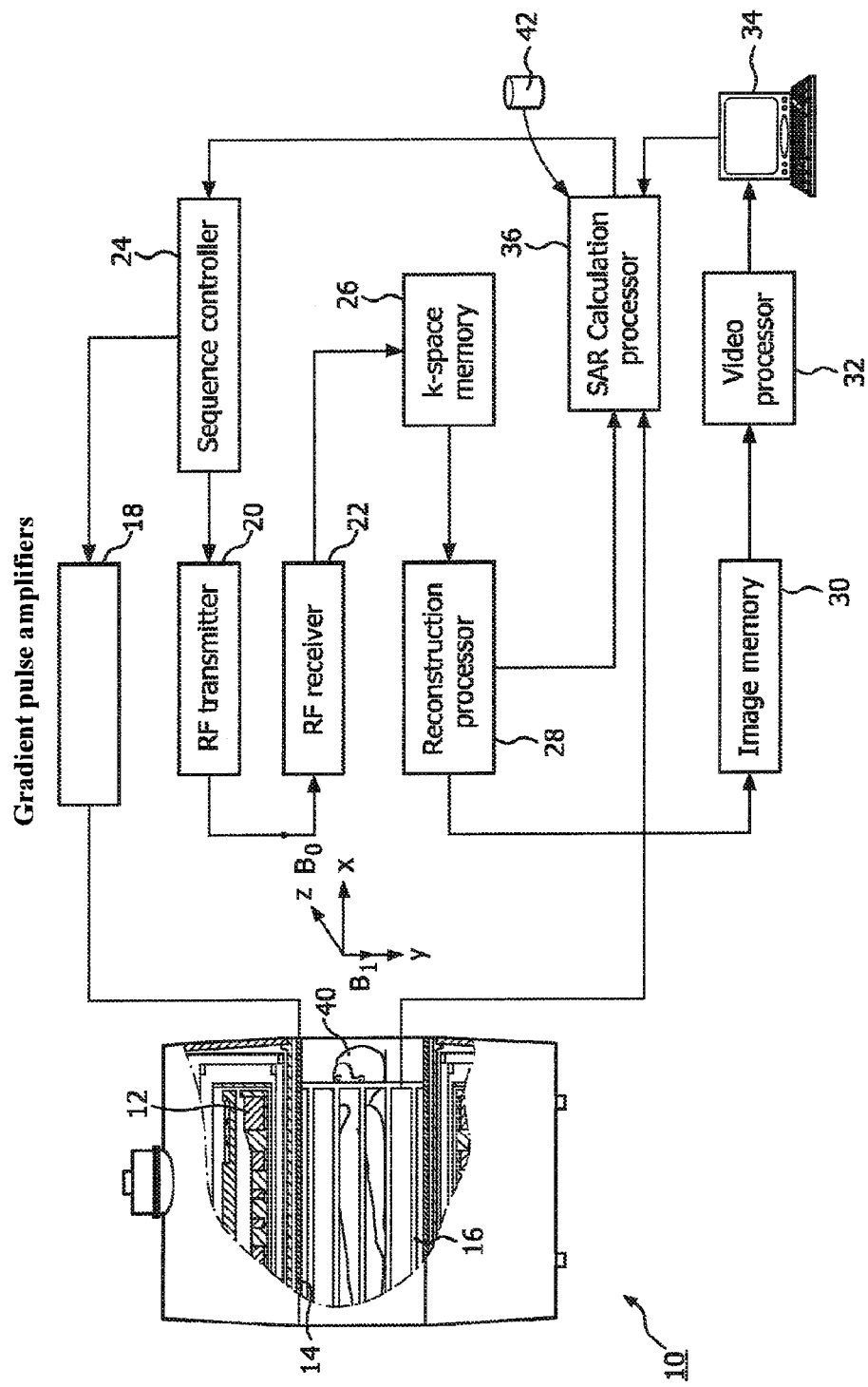
FIG. 1 schematically shows an exemplary embodiment of the magnetic resonance system according to the invention.

FIG. 1 schematically shows an exemplary embodiment of the magnetic resonance system according to the invention. A magnetic resonance scanner 10 is illustrated as a system that includes a solenoidal main magnet assembly 12. In this embodiment the system is a closed bore system. Other magnetic configurations, such as open configurations, of the magnetic resonance scanner are also possible. The main magnet assembly 12 produces a substantially constant main magnetic field $B_0$ oriented along a horizontal axis of an imaging region. It is to be understood that other magnet arrangements, such as vertical, and other configurations are also possible. The main magnet assembly 12 used in a bore type system usually has a field strength in the range of around 0.5 T to 7.0 T, or higher.

The magnetic resonance scanner 10 further comprises a gradient coil assembly 14 that produces magnetic field gradients in an imaging region of a patient 40 for spatially encoding the main magnetic field. Preferably, the gradient coil assembly 14 includes coil segments configured to produce magnetic field gradient pulses in three orthogonal directions, typically longitudinal (z), transverse (x) and vertical (y) directions.

The magnetic resonance scanner 10 further comprises a radio frequency antenna 16 that generates radio frequency pulses for exciting resonance in dipoles of the patient 40. The signals transmitted by the radio frequency antenna 16 are commonly known as the B1 field. The radio frequency antenna 16 as shown in FIG. 1 is a whole body birdcage type coil. The radio frequency antenna 16 also serves to detect resonance signals emanating from the imaging region. The radio frequency antenna 16 is a send and receive coil that images the entire imaging region, however in other embodiments, local send and receive coils, local dedicated receive coils, or dedicated transmit coils are also possible.

Gradient pulse amplifiers 18 deliver controlled electrical currents to the magnetic field gradient assembly 14 to produce selected magnetic field gradients. A radio frequency (RF) transmitter 20, preferably digital, applies radio frequency pulses or pulse packets to the radio frequency antenna 16 to excite selected resonance. A radio frequency receiver 22 is coupled to the coil assembly 16 or in another embodiment separate receive coils to receive and demodulate the induced resonance signals are possible.

To acquire resonance imaging data of the patient 40, the patient is placed inside the imaging region. A sequence controller 24 communicates with the gradient amplifiers 18 and the radio frequency transmitter 20 to supplement the optical manipulation of the region of interest. The sequence controller 24 produces selected repeated echo steady-state or other resonance sequences, spatially encodes such resonances, selectively manipulates or spoils resonances, or otherwise generates selected magnetic resonance signals characteristic of the patient. The generated resonance signals are detected by the RF coil assembly 16 or a local coil, are communicated to the radio frequency receiver 22, are demodulated, and are stored as a k-space representation in a memory 26. Imaging data are reconstructed by a reconstruction processor 28 to produce one or more image representations for storing in an image memory 30. In one embodiment, the reconstruction processor 28 performs an inverse Fourier transform reconstruction.

The resultant image representation is processed by a video processor 32 and displayed on a user interface 34 comprising a human readable display. The user interface 34 is preferably a personal computer or a workstation. Rather than producing a video image, the image representation can be e.g. processed by a printer driver and printed or transmitted over a computer network or the Internet. Preferably, the user interface 34 also allows a technician or another operator or person to communicate with the sequence controller 24 to select magnetic resonance imaging sequences, modify imaging sequences, execute imaging sequences, etc.

A specific energy absorption rate (SAR) processor 36 calculates SAR for portions of the patient within the imaging region. A lookup table containing dielectric properties of human tissue at MR Larmor Frequency and mass density of human tissue is used.

Ampere's law states a relation between magnetic fields H and electric displacement fields D and the electric current density j:

$$\nabla \times \vec{H}(\vec{r}) = \frac{\partial \vec{D}(\vec{r})}{\partial t} + \vec{j}(\vec{r}) \tag{1}$$

The electric conductivity σ is related to the current density via:

$$\vec{j}(\vec{r}) = \sigma(\vec{r})\vec{E}(\vec{r}) \tag{2}$$

The electric displacement can be expressed via the permittivity of free space $\in_0$ and the relative permittivity $\in_r$ and the electric field. Isotropic media are assumed:

$$\vec{D}(\vec{r}) = \in_0 \in_r(\vec{r})\vec{E}(\vec{r}) \tag{3}$$

Substituting of equations (2) and (3) into equation (1) and assuming time-harmonic fields yields:

$$\nabla \times \underline{\vec{H}}(\vec{r})/i\omega \underline{\in}(\vec{r}) = \underline{\vec{E}}(\vec{r}) \tag{4}$$

with $\underline{\in}(\vec{r}) = i\omega \in_0 \in_r(\vec{r}) + \sigma(\vec{r})$. From the knowledge of E and σ, local SAR is readily obtained:

$$SAR(\vec{r}) = \frac{\sigma(\vec{r})E(\vec{r})E^*(\vec{r})}{2\rho(\vec{r})} = \frac{\sigma(\vec{r})}{2\omega^2\rho(\vec{r})} \frac{\nabla \times \underline{\vec{H}}(\vec{r})}{\underline{\varepsilon}(\vec{r})} \left(\frac{\nabla \times \underline{\vec{H}}(\vec{r})}{\underline{\varepsilon}(\vec{r})}\right)^* \tag{5}$$

The local SAR can be computed if 1) magnetic fields and 2) electric properties and mass density are known. The basic idea of the invention is to measure item 1) and to make a model for item 2). In the following, these two items are discussed in more detail.

Circularly polarized magnetic field components are related to the Cartesian components via:

$$\underline{H}^+ = (\underline{H}_x + i\underline{H}_y)/2, \underline{H}^- = (\underline{H}_x - i\underline{H}_y)/2. \tag{6}$$

and vice versa:

$$\underline{H}_x = \underline{H}^+ + \underline{H}^-$$

$$\underline{H}_y = -i(\underline{H}^+ - \underline{H}^-) \tag{7}$$

The positive field component H⁺ (corresponding to the transmit sensitivity) can be measured using B₁ mapping techniques as known in the art, see for example the Yarnykh article "Yarnykh V L. Actual flip-angle imaging in the pulsed steady state: a method for rapid three-dimensional mapping of the transmitted radio frequency field. MRM 57 (2007) 192-200". In a birdcage coil configuration, the other two field components H⁻ and $H_z$ can be neglected because of $\underline{H}^+ \gg H_z$ and $\underline{H}^+ \gg \underline{H}^-$.

The method according to the invention assigns literature values for electric properties and mass density to segmented images. Usually, B₁ mapping techniques are based on post processing anatomical images, see for example the Yarnykh article. These images could be re-used for automated segmentation and identification of tissue types. Segmentation and identification can be done with different resolution as required, balancing CPU time and the result's accuracy. In the simplest version, the whole body can be taken as a single segment with an average σ and ∈. More detailed versions might shrink segments down to voxel size. Due to the prescan character of the B₁ map in this framework, a moderate voxel size is expected for the sake of acceptable acquisition time.

Figure 2:
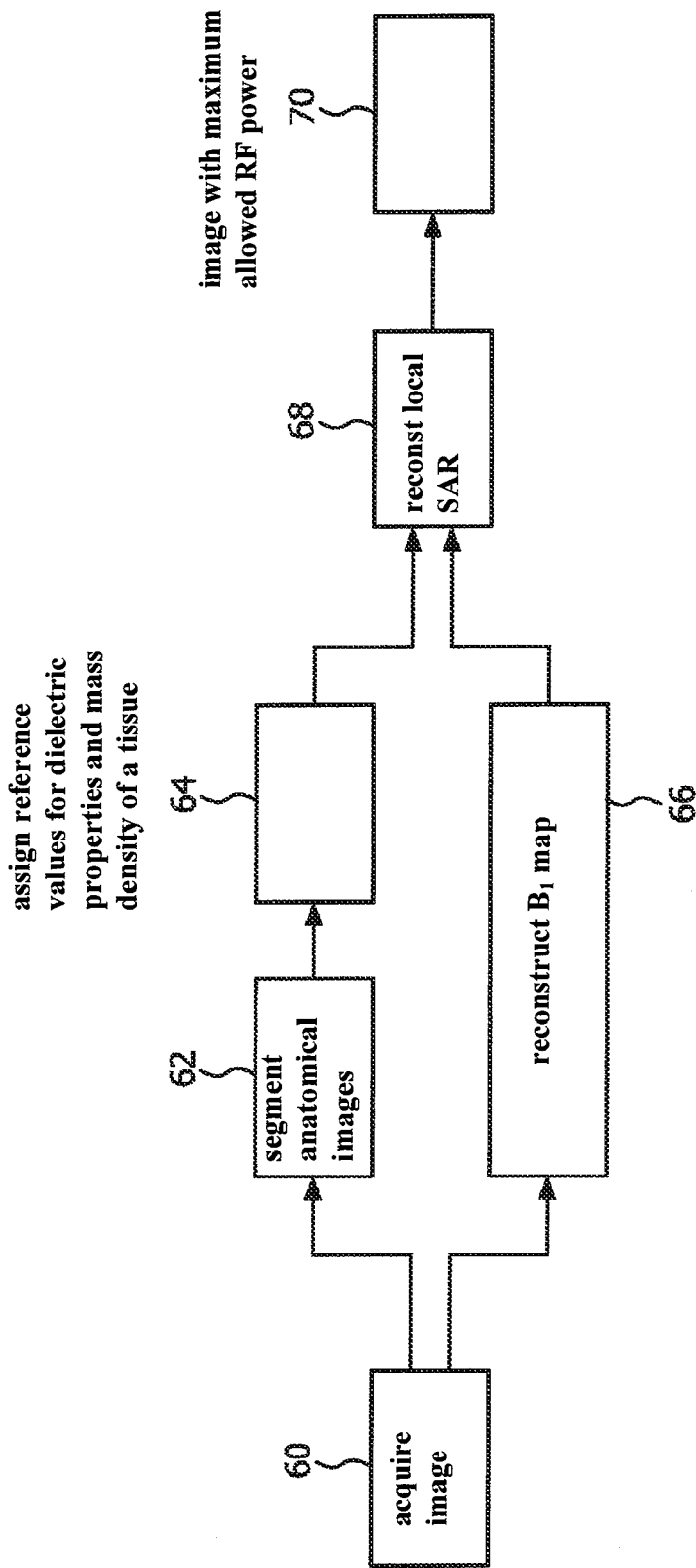
FIG. 2 schematically shows a workflow diagram of a version of the method according to the invention.

FIG. 2 schematically shows a workflow diagram of an exemplary embodiment of the method according to the invention. The step 60 represents an image acquisition, e.g. 2 FFE images in dual TR steady state as in AF1 B1 mapping. There are two further steps: step 66 representing a reconstruction of a B1 map and step 62 representing a segmentation of anatomical images of a patient. Step 62 is followed by step 64 representing an assignment of reference values for dielectric properties and mass density of a tissue. The results of steps 64 and 66 are needed as an input for the step 68 representing a local SAR reconstruction. Once the local SAR reconstruction is done the step 70 representing an imaging with the maximum allowed RF power, i.e. without a risk for damaging the tissue, can be executed.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

LIST OF REFERENCE NUMERALS 10 a magnetic resonance scanner
12 a solenoidal main magnet assembly
14 a gradient coil assembly
16 a radio frequency antenna
18 gradient pulse amplifiers
20 a radio frequency transmitter
22 a radio frequency receiver
24 a sequence controller 26 a k-space memory
28 a reconstruction processor
30 an image memory
32 a video processor
34 a user interface
36 a specific energy absorption rate processor
40 an object
42 a database
60 an image acquisition
62 a segmentation of anatomical images of a patient
64 an assignment of reference values for dielectric properties and mass density of a tissue
66 a reconstruction of a $B_1$ map
68 a local SAR reconstruction
70 an imaging with the maximum allowed RF power

The invention claimed is:

1. A method for in vivo calculating a local specific energy absorption rate based on an electric parameter and a mass density of a segmented geometry of an object and a magnetic field vector distribution of a radio frequency antenna, the method comprising acts of:
segmenting an image of the object to obtain the segmented geometry of the object;
obtaining pre-determined values of the electric parameter and the mass density taken from literature for tissue similar to a tissue of interest within the object included in the segmented geometry to be irradiated with radio frequency power for obtaining images of the tissue of interest;
assigning the pre-determined values to the tissue of interest;
performing a magnetic resonance scan;
estimating the magnetic field vector distribution by a magnetic field mapping method based on the magnetic resonance scan performed by a scanner; and
in vivo calculating the local specific energy absorption rate specific to the scanner and to an anatomy and a position of the object based on the pre-determined values of the electric parameter and the mass density assigned to the tissue of interest and the estimated magnetic field vector distribution.

2. The method as claimed in claim 1, wherein the segmented geometry of the object is obtained from a survey scan of the object.

3. The method as claimed in claim 1, wherein a $B_1$ mapping method is used for the magnetic field mapping method based on the magnetic resonance scan.

4. The method as claimed in claim 3, wherein the estimating act estimates the magnetic field vector distribution from a measurement of a $H^+$ component of a $B_1$ field and wherein a $H^-$ component and Hz component of the $B_1$ field are considered to be null.

5. The method as claimed in claim 1, wherein the electric parameter includes the electric conductivity and permittivity of the segmented geometry.

6. A magnetic resonance system comprising:
a magnet for generating a magnetic field in an examination region;
a radio frequency antenna for emitting a radio frequency field in the examination region and receiving an induced magnetic resonance signal from the examination region; and
a specific energy absorption rate calculation processor for in vivo calculating a specific energy absorption rate for an object accommodated in the examination region based on both an estimate of the magnetic field obtained from the received induced magnetic resonance signal and an electric parameter of a tissue of interest within the object and a mass density of the tissue of interest as assigned to a segmented object's geometry, wherein the electric parameter and the mass density are obtained from a database including values that are assigned to the electric parameter of the tissue of interest at a magnetic resonance Larmor Frequency and the mass density of the tissue of interest.

7. The magnetic resonance system as claimed in claim 6, wherein the segmented geometry of the object is obtained from a survey scan of the object.

8. The magnetic resonance system as claimed in claim 6, wherein a $B_1$ mapping method is used for the estimate of the magnetic field.

9. The magnetic resonance system as claimed in claim 8, wherein the estimate of the magnetic field is obtained from a measurement of a $H^+$ component of a $B_1$ field and wherein a $H^-$ component and Hz component of the $B_1$ field are considered to be null.

10. The magnetic resonance system as claimed in claim 6, wherein the electric parameter includes the electric conductivity and permittivity of the segmented geometry.

11. The magnetic resonance system as claimed in claim 6, wherein the pre-determined values of the electric parameter and the mass density are taken from literature.

12. The magnetic resonance system as claimed in claim 6, wherein the system comprises a user interface for identifying at least one region of interest for which the specific energy absorption rate is to be determined in vivo by the specific energy absorption rate calculation processor.

13. A non-transitory computer readable medium comprising computer instructions which, when executed by a processor, configure the processor to perform a method for in vivo calculating a local specific energy absorption rate based on an electric parameter and a mass density of a segmented geometry of an object and a magnetic field vector distribution of a radio frequency antenna, comprises acts of:
segmenting an image of the object to obtain the segmented geometry of the object obtaining pre-determined values of the electric parameter and the mass density taken from literature for tissue similar to a tissue of interest within the object included in the segmented geometry to be irradiated with radio frequency power for obtaining images of the tissue of interest;
assigning the pre-determined values to the tissue of interest;
performing a magnetic resonance scan;
estimating the magnetic field vector distribution by a magnetic field mapping method based on the magnetic resonance scan performed by a scanner; and
in vivo calculating the local specific energy absorption rate specific to the scanner and to an anatomy and a position of the object based on the pre-determined values of the electric parameter and the mass density assigned to the tissue of interest and the estimated magnetic field vector distribution.

* * * * *